US012760414B2

(12) United States Patent
Pathak et al.

(10) Patent No.: US 12,760,414 B2
(45) Date of Patent: Oct. 13, 2026

(54) METHOD FOR AN AMORPHOUS BORON NITRIDE LAYER AND ASSOCIATED AMORPHOUS BORON NITRIDE LAYERS

(71) Applicant: ASM IP Holding B.V., Almere (NL)

(72) Inventors: Gaurav Pathak, Helsinki (FI); Mikko Ruoho, Vantaa (FI); Viljami J. Pore, Helsinki (FI); Ming Liu, Helsinki (FI)

(73) Assignee: ASM IP Holding B.V., Almere (NL)

( * ) Notice: Subject to any disclaimer, the term of this patent is extended or adjusted under 35 U.S.C. 154(b) by 285 days.

(21) Appl. No.: 18/620,116

(22) Filed: Mar. 28, 2024

(65) Prior Publication Data

US 2024/0327982 A1 Oct. 3, 2024

Related U.S. Application Data

(60) Provisional application No. 63/456,105, filed on Mar. 31, 2023.

(51) Int. Cl.
*C23C 16/455* (2006.01)
*C23C 16/34* (2006.01)
*C23C 16/46* (2006.01)

(52) U.S. Cl.
CPC ...... *C23C 16/45542* (2013.01); *C23C 16/342* (2013.01); *C23C 16/45553* (2013.01); *C23C 16/46* (2013.01)

(58) Field of Classification Search
None
See application file for complete search history.

(56) References Cited

U.S. PATENT DOCUMENTS

| | | | | |
|---|---|---|---|---|
| 2007/0128858 | A1 | 6/2007 | Haukka | |
| 2018/0040476 | A1 | 2/2018 | Wolf | |
| 2020/0318237 | A1 | 10/2020 | Fukazawa | |
| 2022/0076996 | A1* | 3/2022 | Blanquart | H10P 14/6339 |
| 2022/0254628 | A1* | 8/2022 | Shero | C23C 16/342 |
| 2023/0098689 | A1 | 3/2023 | Dezelah | |
| 2023/0143678 | A1 | 5/2023 | Jozef | |
| 2023/0272527 | A1 | 8/2023 | Fukazawa | |

OTHER PUBLICATIONS

Large-scale synthesis of uniform hexagonal boron nitride films by plasma-enhanced atomic layer deposition, Hamin Park et al, Scientific Reports I 7:40091 I DOI: 10.1038/srep40091.

* cited by examiner

*Primary Examiner* — Michael G Miller
(74) *Attorney, Agent, or Firm* — Banner & Witcoff, Ltd.

(57) ABSTRACT

Methods for depositing amorphous boron nitride layers on a substrate are provided. Exemplary methods include providing a boron precursor to a reaction chamber and providing nitrogen reactive species to the reaction chamber.

20 Claims, 4 Drawing Sheets

METHOD FOR AN AMORPHOUS BORON NITRIDE LAYER AND ASSOCIATED AMORPHOUS BORON NITRIDE LAYERS

CROSS-REFERENCE TO RELATED APPLICATION(S)

This application claims the benefit of U.S. Provisional Application 63/456,105 filed on Mar. 31, 2023, the entire contents of which are incorporated herein by reference.

FIELD OF INVENTION

The present disclosure relates generally to the field of semiconductor processing methods and systems, and to the field of device and integrated circuit manufacture. More particularly, the present disclosure relates to methods for forming amorphous boron nitride layers and the associated amorphous boron nitride layers formed by such methods

BACKGROUND OF THE DISCLOSURE

Use of amorphous boron nitride (BN) in the formation of electronic devices may be desirable for a number of reasons. For example, amorphous boron nitride may be used to form layers with desired dielectric constants, etch or chemical resistance, etch selectivity (e.g., wet or dry etch selectivity relative to silicon oxide and silicon nitride), mechanical properties (e.g., chemical mechanical polishing resistance compared to other dielectric materials), and the like.

Methods for depositing boron nitride based layers can include plasma-enhanced chemical vapor deposition (PECVD) processes that use borazine as a precursor. Borazine is a relatively expensive precursor. Further, borazine can polymerize during processing, which can lead to undesired contamination and/or film properties. Other techniques have been used to deposit boron nitride materials, but such techniques can result in films with relatively poor conformality, wet etch rate ratios, poor stability over an extended time period, and/or boron nitride layers with undesirably high dielectric constants. Accordingly, improved methods for forming amorphous boron nitride and structures including high quality amorphous nitride layer are highly desirable.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

In accordance with at least one embodiment of the disclosure, a method of forming an amorphous boron nitride layer on a surface of a substrate is provided. As set forth in more detail below, exemplary methods can provide an improvement in the conformality of the deposited amorphous boron nitride layers, whilst also producing amorphous boron nitride layers with desirable material properties, including, but not limited to, a low dielectric constants, a low wet etch rate ratio, improved stability over an extended time period, and/or more desirable mechanical properties, compared to amorphous boron nitride layers formed using other techniques.

In accordance with examples of the disclosure, exemplary methods for forming amorphous boron nitride layers include, seating a non-planar substrate within a reaction chamber, and depositing an amorphous boron nitride layer on the non-planar substrate by performing one or more deposition cycles of a plasma enhanced atomic layer deposition (PEALD) process. A unit deposition cycle of the PEALD process includes, contacting the non-planar substrate with a vapor phase reactant comprising a boron precursor, and contacting the non-planar substrate with one or more reactive species generated from a plasma produced from a gas selected from the group consisting of hydrogen ($H_2$), nitrogen ($N_2$), ammonia ($NH_3$), hydrazine ($N_2H_4$), alkyl-hydrazine derivates, and mixtures thereof, wherein the amorphous boron nitride layer is deposited conformally with a step coverage greater than 90%.

In some embodiments, the boron precursor comprises boron triiodide ($BI_3$).

In some embodiments, the plasma is produced from a gas consisting essentially of nitrogen ($N_2$) and hydrogen ($H_2$).

In some embodiments, the plasma is produced from a gas consisting essentially of nitrogen ($N_2$).

In some embodiments, the exemplary methods of the disclosure further include heating the substrate to a deposition temperature between 150° C. and 350° C.

In some embodiments, the amorphous boron nitride layer is deposited at a growth rate per cycle (GPC) between 0.2 nm/cycle and 0.4 nm/cycle.

In some embodiments, the amorphous boron nitride layer is deposited with a dielectric constant of less than 4.

In some embodiments, the amorphous boron nitride layer is deposited with a dielectric constant of less than 3.

In some embodiments, the amorphous boron nitride layer is deposited with a composition ratio of boron to nitrogen of 1:1, or greater.

In some embodiments, the amorphous boron nitride layer is deposited with a wet etch rate ratio (WERR) of less than 0.2.

In some embodiments, the one or more reactive species are generated by a direct plasma.

In accordance with further examples of the disclosure, exemplary methods for forming amorphous boron nitride layers include, seating a substrate within a reaction chamber; and depositing an amorphous boron nitride layer on the substrate by performing one or more deposition cycles of a plasma enhanced atomic layer deposition (PEALD) process. A unit deposition cycle of the PEALD process includes, contacting the substrate with a vapor phase reactant comprising a boron triiodide ($BI_3$) precursor, and contacting the substrate with nitrogen reactive species generated from a gas consisting essentially of nitrogen ($N_2$).

In some embodiments, the substrate comprises a non-planar substrate including a number of high aspect ratio features having an aspect ratio greater than 20:1.

In some embodiments, the amorphous boron nitride layer is deposited conformally over the non-planar substrate with a step coverage greater than 90%.

In some embodiments, the amorphous boron nitride layer is deposited with a dielectric constant of less than 3.

In some embodiments, the amorphous boron nitride layer is deposited with a wet etch rate ratio (WERR) of less than 0.2.

In accordance with further examples of the disclosure, exemplary methods for forming amorphous boron nitride layers include, seating a substrate within a reaction chamber, and depositing an amorphous boron nitride layer on the substrate by performing one or more deposition cycles of a plasma enhanced atomic layer deposition (PEALD) process. A unit deposition cycle of the PEALD process includes, contacting the substrate with a vapor phase reactant comprising boron triiodide ($BI_3$), and contacting the substrate with one or more reactive species generated from a plasma produced from a gas consisting essentially of nitrogen ($N_2$), and hydrogen ($H_2$).

In some embodiments, the amorphous boron nitride layer is deposited with a composition ratio of boron to nitrogen of 1:1 or greater.

In some embodiments, the amorphous boron nitride layer is deposited with a wet etch rate ratio (WERR) of less than 0.2.

In accordance with further examples of the disclosure, exemplary amorphous boron nitride films are disclosed deposited according to the methods disclosed herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 3:
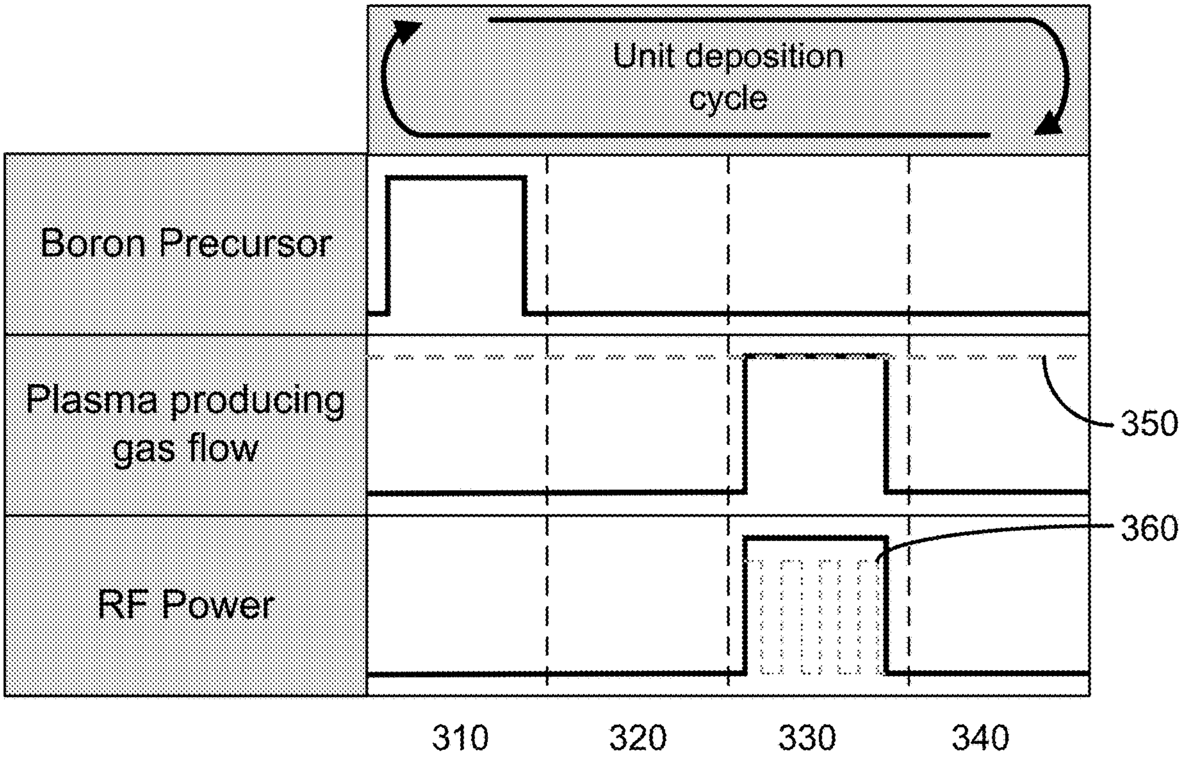
Figure 4:
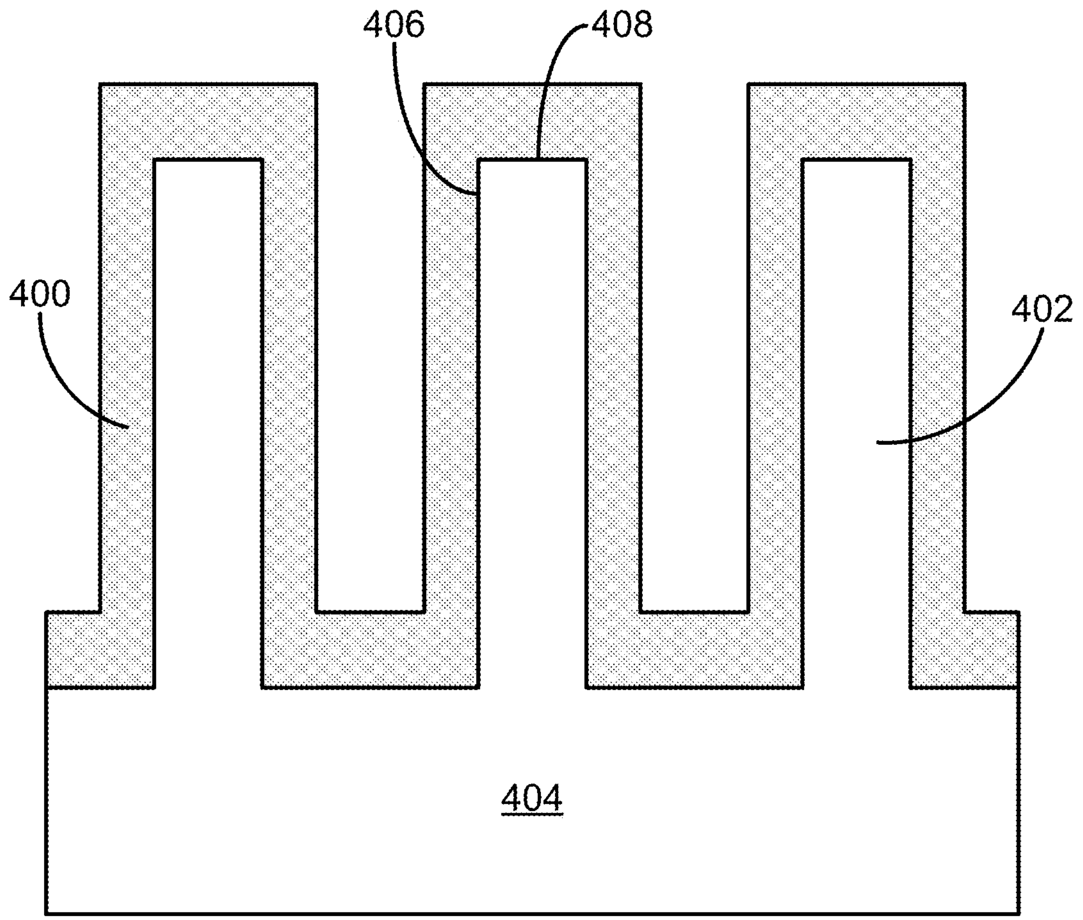

FIG. 3 illustrates an exemplary PEALD deposition cycle for depositing an amorphous boron nitride layer in accordance with a least one embodiment of the present disclosure; and FIG. 4 illustrates a cross-sectional schematic view of a non-planar substrate including high aspect ratio features upon which an amorphous boron nitride is deposited in accordance with at least one embodiment of the present disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Various embodiments of the present disclosure relate to methods of forming amorphous boron nitride layers on a surface of a substrate, and particular to methods for depositing amorphous boron nitride layers with improved material characteristics, including but not limited, conformality, wet etch rate ratio (WERR), dielectric constant, and stability over an extended time period.

As used herein, the term "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

As used herein, the term "plasma enhanced atomic layer deposition" (PEALD) may refer to a vapor deposition process in which deposition cycles, preferably a plurality of consecutive deposition cycles, are conducted in a reaction chamber. Typically, during each unit deposition cycle a precursor is chemisorbed to a deposition surface (e.g., a substrate surface or a previously deposited underlying surface such as material from a previous PEALD cycle), forming a monolayer or sub-monolayer that does not readily react with additional precursor (i.e., a self-limiting reaction). Thereafter, reactive species generated by a plasma produced a gas may subsequently be introduced into or generated in the process chamber for use in converting the chemisorbed precursor to the desired material on the deposition surface. Further, purging steps may also be utilized during each unit deposition cycle to remove excess precursor, reactive species, and/or reaction byproducts from the process chamber.

As used herein, the term "reactive species" may refer to one or more species generated by the plasma excitation of a gas (including gas mixtures) and may include, but is not limited to, ions, radicals, and excited species.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. Further, the term "substrate" may refer to any underlying material or materials that may be used, or upon which, a device, a circuit, or a film may be formed. The "substrate" may be continuous or non-continuous; rigid or flexible; solid or porous. The "substrate" may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e., ceramic fibers or polymer fibers). Continuous substrates may also comprise carriers or sheets upon which non-continuous substrates are mounted.

As used herein, the term “film” and/or “layer” can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

In some embodiments of the disclosure, the substrate may comprise a patterned non-planar substrate including high aspect ratio features, such as, for example, trench structures, vertical gap features, and/or fin structures. Such high aspect ratio features may have an aspect ratio (height:width) which may be greater than 2:1, or greater than 5:1, or greater than 10:1, or greater than 25:1, or greater than 50:1, or even greater than 100:1, wherein “greater than” as used in this example refers to a greater distance in the height (or depth) of the gap feature.

As used herein, a “structure” can be or include a substrate as described herein. Structures can include one or more layers overlying the substrate, such as one or more layers formed according to a method according to the disclosure.

As used herein, “amorphous boron nitride” (also referred to hereinafter as a-BN) can be a material that can be represented by a chemical formula that includes boron and nitrogen. In some embodiments, amorphous boron nitride may not include significant proportions of elements than boron and nitride. In some embodiments, the amorphous boron nitride comprises a-BN. In some embodiments, the amorphous boron nitride may consist essentially of a-BN. In some embodiments, the amorphous boron nitride may consist of boron nitride. A layer consisting of amorphous boron nitride may include an acceptable amount of impurities, such as hydrogen, oxygen, iodine, and/or the like that may originate from one or more precursors used to deposit the a-BN layer. In addition, the crystal structure of an amorphous boron nitride layer deposited by the methods disclosed herein exhibits no discernable ordering, and/or no significant long range ordering, of the crystal structure as would otherwise be evident in a crystalline, or a polycrystalline layer of material (e.g., as determined by such methods as x-ray diffraction (XRD) and/or Raman spectroscopy). For example, XRD analysis of an amorphous boron nitride layer deposited by the methods disclosed herein can result in x-ray data which does not include discernable peaks corresponding to single crystalline boron nitride (BN) and/or can result in x-ray data that only includes a number of peaks corresponding to short term ordering in the amorphous boron nitride layer resulting from nanocrystalline short range ordering in the a-BN layer. The presence of such nanocrystalline regions in the amorphous boron nitride layers deposited by the methods disclosed herein do not constitute a “crystalline” or a “polycrystalline” a-BN layer.

Further, in this disclosure, any two numbers of a variable can constitute a workable range of the variable, and any ranges indicated may include or exclude the endpoints. Additionally, any values of variables indicated (regardless of whether they are indicated with “about” or not) may refer to precise values or approximate values and include equivalents, and may refer to average, median, representative, majority, or the like. Further, in this disclosure, the terms “including,” “constituted by” and “having” can refer independently to “typically or broadly comprising,” “comprising,” “consisting essentially of,” or “consisting of” in some embodiments. In this disclosure, any defined meanings do not necessarily exclude ordinary and customary meanings in some embodiments.

As used herein, the term “comprising” indicates that certain features are included, but that it does not exclude the presence of other features, as long as they do not render the claim unworkable. In some embodiments, the term “comprising” includes “consisting.”

As used herein, the term “consisting” indicates that no further features are present in the apparatus/method/product apart from the ones following said wording. When the term “consisting” is used referring to a chemical compound, substance, or composition of matter, it indicates that the chemical compound, substance, or composition of matter only contains the components which are listed. Likewise, when the term “consisting essentially” is used referring to a chemical compound, substance, or composition of matter, it indicates that the chemical compound, substance, or composition of matter contains the components which are listed but can also containing trace elements and/or impurities that do not materially affect the characteristics of said chemical compound, substrate, or composition of matter. This notwithstanding, the chemical compound, substance, or composition of matter may, in some embodiments, comprise other components as trace elements or impurities, apart from the components that are listed.

When specific process conditions are provided in this disclosure, they are provided for a reaction chamber volume of 1 liter and for 300 mm wafers. The skilled person understands that these values can be readily extended to other reaction chamber volumes and wafer sizes.

The embodiments of the present disclosure include methods for forming amorphous boron nitride layers by plasma enhanced atomic layer deposition (PEALD) processes and particularly methods for depositing conformal amorphous boron nitride layers by PEALD processes which have improved material characteristics, including but not limited, a low wet etch rate ratio (WERR), a low dielectric constant, and high stability over time.

Therefore, in some embodiments of the disclosure, plasma enhanced atomic layer deposition (PEALD) processes can be used to deposit amorphous boron nitride layers, referred to herein after as a-BN layers or films. Briefly, a substrate or a workpiece is seated within a reaction chamber and subjected to alternately repeated surface reactions. In some embodiments, a-BN layers are formed by repetition of self-limiting PEALD cycles. In some embodiments, each PEALD unit deposition cycle comprises at least two distinct phases. The prevision and removal of a reactant from the reaction chamber may be considered a phase.

In a first phase, a vapor phase reactant comprising a boron precursor can be introduced into the reaction chamber and contacts the substrate therein, wherein the boron precursor may form no more than about one monolayer on the substrate surface. This reactant is also referred to herein as the “boron precursor”.

In a second phase, a second reactant comprising one or more reactive species is introduced into the reaction chamber, or is generated within the reaction chamber, and contacts the substrate therein, wherein the one or more reactive species can convert the absorbed boron precursor to an a-BN layer. In some embodiments of the disclosure, the second reactant may comprise one or more reactive species generated from a plasma produced from a gas (including gas mixtures) selected from a group consisting of hydrogen ($H_2$), nitrogen ($N_2$), and mixtures thereof.

As previously stated, the PEALD processes of the present may form a-BN layers by performing one or more repetitions of a unit deposition cycle, wherein a unit deposition cycle may include the generation of reactive species from a plasma. As a non-limiting example, the deposition cycles may be performed using suitable apparatus such as the exemplary apparatus 100 illustrated in FIG. 1.

Figure 1:
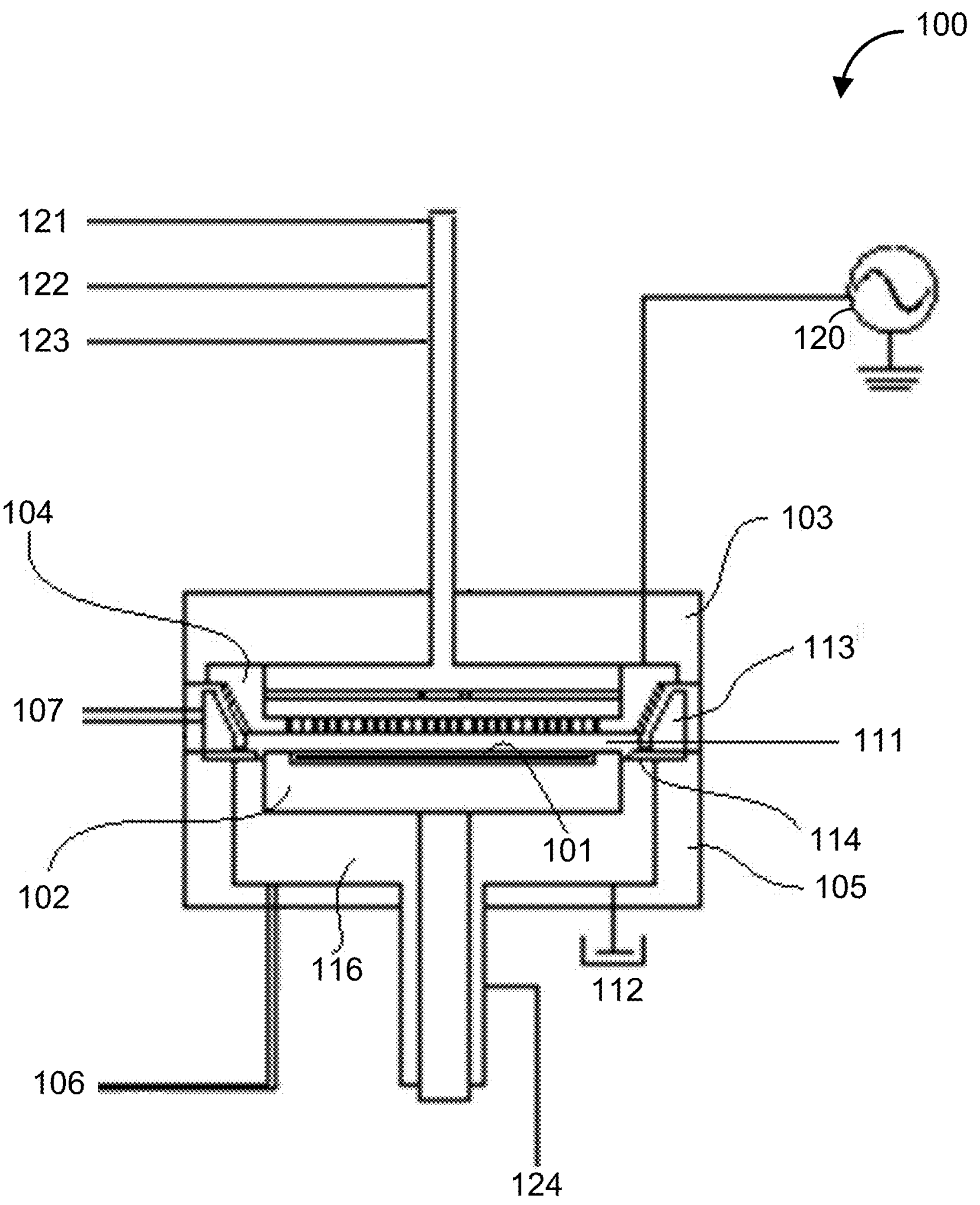
FIG. 1 illustrates a simplified schematic representation of a plasma-enhanced atomic layer deposition (PEALD) apparatus suitable for depositing an amorphous boron nitride layer in accordance with at least one embodiment of the present disclosure.

In more detail, FIG. 1 is a schematic view of an exemplary PEALD apparatus 100, desirably in conjunction with controls programmed to conduct the sequences described below, usable in some embodiments of the present invention. In FIG. 1, by providing a pair of electrically conductive flat-plate electrodes 104 and 102 in parallel and facing each other in the interior 111 (reaction zone) of a reaction chamber 103, applying RF power (e.g., 13.56 MHz, or 27 MHz, or 54 MHz, or 108 MHZ) 120 to one side, and electrically grounding the other side 112, a plasma is excited between the electrodes. A temperature regulator is provided in a lower stage 102 (the lower electrode), and a temperature of a substrate 101 placed thereon is kept constant at a given deposition temperature. The upper electrode 104 serves as a shower head plate as well, and reactant gas and precursor gas are introduced into the reaction chamber 103 through a gas line 121 and a gas line 122, respectively, and through the shower head plate 104.

Additionally, in the reaction chamber 103, a circular duct 113 with an exhaust line 107 is provided, through which gas in the interior 111 of the reaction chamber 103 is exhausted. Additionally, a dilution gas is introduced into the reaction chamber 103 through a gas line 123. Further, a transfer chamber 105 disposed below the reaction chamber 103 is provided with a seal gas line 124 to introduce seal gas into the interior 111 of the reaction chamber 103 via the interior 116 (transfer zone) of the transfer chamber 105 wherein a separation plate 114 for separating the reaction zone and the transfer zone is provided (a gate valve through which a wafer is transferred into or from the transfer chamber 105 is omitted from this figure). The transfer chamber is also provided with an exhaust line 106.

An exemplary method 200 for depositing an a-BN layer utilizing a plasma enhanced atomic layer deposition process is illustrated with reference to FIG. 2. The exemplary method 200 may comprise two phases, a first phase comprising, contacting the substrate with a boron precursor (step 202), and a second phase comprising contacting the substrate with one or more reactive species generated from a plasma (step 204).

In more detail, the exemplary method 200 may commence by seating a substrate within a suitable reaction chamber (step 201), such as the reaction chamber of exemplary PEALD apparatus 100 of FIG. 1. Once the substrate is disposed within the reaction chamber, the substrate may be heated to a desired deposition temperature. For example, the substrate may be heated to a deposition temperature of less than 500° C., or less than 450° C., or less than 350° C., or less than 300° C., or less than 250° C., or less than 200° C., or less than 150° C., or less than 100° C. In some embodiments of the disclosure, the deposition temperature (i.e., the substrate temperature during the PEALD process) may be greater than room temperature, between 50° C. and 500° C., or between 75° C. and 400° C., or between 150° C. and 350° C.

In addition to controlling the deposition temperature of the substrate, the pressure in the reaction chamber may also be regulated to enable deposition of an a-BN layer with desired properties. For example, in some embodiments of the disclosure, the pressure within the reaction chamber may be less than 760 Torr, or between 0.1 Torr and 50 Torr, or between 0.2 and 30 Torr, or between 0.5 Torr and 7 Torr, or between 1 Torr to 3 Torr.

The exemplary method 200 (FIG. 2) may continue by introducing a boron precursor into the reaction chamber and contacting the substrate with the boron precursor (step 202). In some embodiments, the boron precursor is supplied to the reaction chamber as a vapor phase reactant. The boron precursor gas may be considered "volatile" for the purposes of the present disclosure if the species exhibits sufficient vapor pressure under the process conditions to transport species to the substrate surface in sufficient concentration to saturate the exposed surfaces.

In some embodiments of the disclosure, a vapor phase boron precursor comprises boron and at least one halogen selected from the group consisting of iodine, chlorine, and bromine. In some embodiments, the boron precursor comprises one or more boron halides. In accordance with some embodiments of the disclosure, the boron precursor consists of boron and one or more of iodine, chlorine, and bromine. In some embodiments, the boron precursor may have a general chemical formula given as $BX_aY_{3-a}$, wherein B is boron, and each of X and Y are independently selected from chlorine, bromine, and iodine, and wherein $0 \le a \le 3$. In some embodiments, the boron precursor does not include fluorine and/or chlorine. In some embodiments, the boron precursor can be or includes boron triiodide ($BI_3$), boron trichloride ($BCl_3$) and/or boron tribromide ($BBr_3$). In some embodiments, the boron precursor is selected from the group consisting of boron triiodide ($BI_3$), boron trichloride ($BCl_3$), and boron tribromide ($BBr_3$), and mixtures thereof. In some embodiments, the boron precursor comprises boron triiodide ($BI_3$). In some embodiments, the boron precursor consists substantially of, or consists of boron triiodide ($BI_3$).

In some embodiments, the boron precursor may be pulsed into the reaction chamber for a time period from about 0.05 second to about 5.0 seconds, or from about 0.1 seconds to about 3 seconds, or even about 0.2 seconds to about 1.0 seconds, such as about 0.3 seconds or about 0.5 seconds. Unless otherwise noted, the term "pulse" does not restrict the length or duration of the pulse and a pulse may be any length of time. In addition, during the contacting of the substrate with the boron precursor, the flow rate of the boron precursor may be less than 1,000 sccm, less than 500 sccm, or less than 300 sccm, or less than 200 sccm, or less than 100 sccm, or even less than 50 sccm. In addition, during the contacting of substrate with the boron precursor the flow rate of the boron precursor may range from about 2 to 500 sccm, from about 10 to 300 sccm, or from about 50 to about 200 sccm.

After sufficient time for at least a monolayer to adsorb on the substrate surface, excess boron precursor may be removed from the reaction chamber. In some embodiments, the excess boron precursor may be purged by stopping the flow of the boron precursor while continuing to flow a carrier gas, a purge gas, or a gas mixture, for a sufficient time to diffuse or purge excess reactants and reactant by-products, if any, from the reaction chamber. In some embodiments, the excess boron precursor may be purged with aid of one or more inert gases, such as nitrogen, helium or argon, that may be flowing throughout the exemplary PEALD method 200 (FIG. 2).

Figure 2:
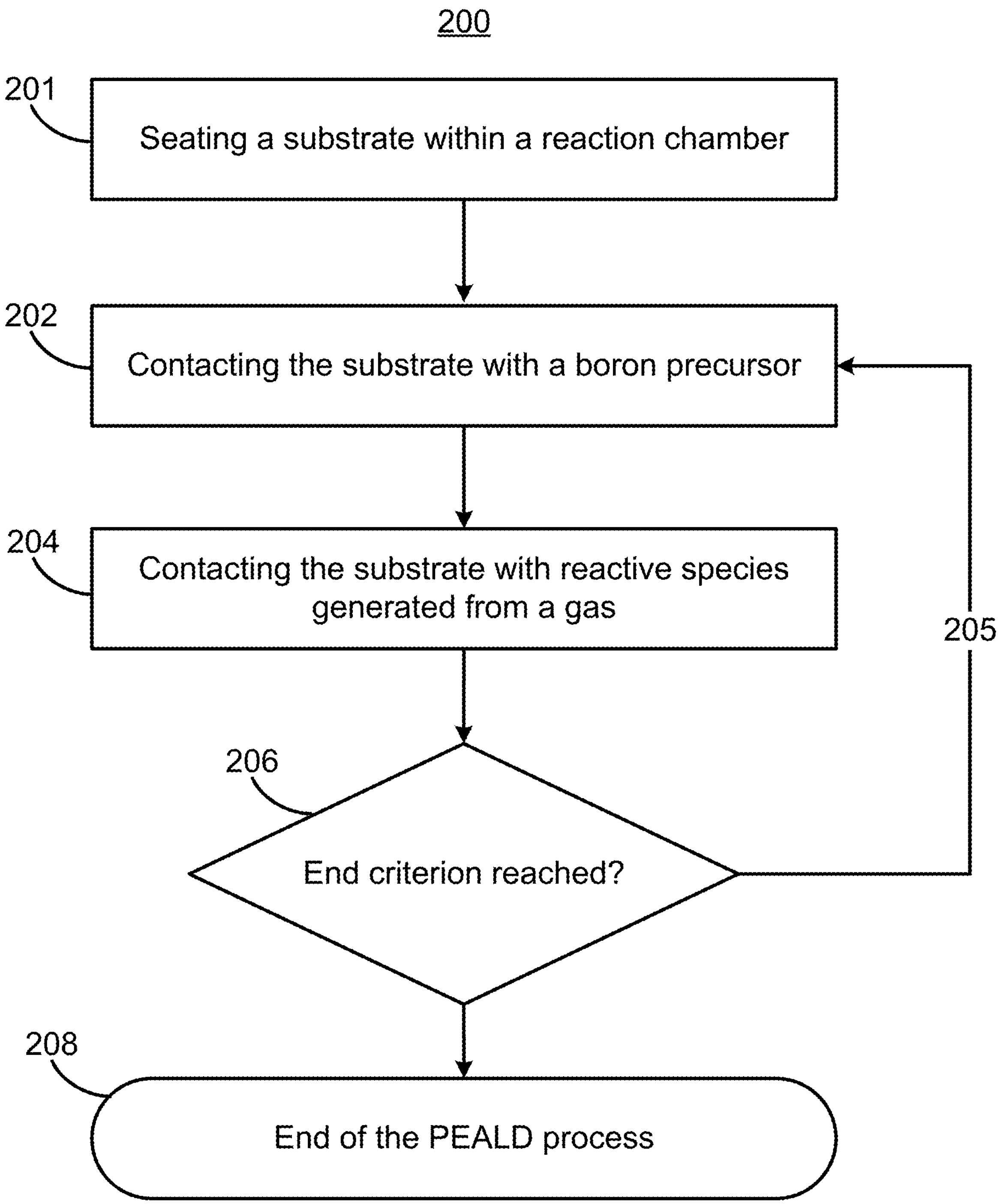
FIG. 2 illustrates an exemplary deposition sequence for depositing an amorphous boron nitride layer in accordance with at least one embodiment of the present disclosure.

The exemplary method 200 may continue by, contacting the substrate with one or more reactive species generated from a plasma produced from a gas (also referred to as the plasma gas or plasma forming gas), as illustrated by process step 204 of FIG. 2. In some embodiments, the process step 205 comprises, contacting the substrate with one or more reactive species generated from a gas comprising nitrogen ($N_2$). In such embodiments, the reactive species generated from the nitrogen ($N_2$) plasma gas can comprise nitrogen reactive species, e.g., atomic nitrogen, nitrogen ions, nitrogen radicals, and excited species of nitrogen. In some embodiments, a nitrogen-based plasma can be produced from a gas comprising at least one of nitrogen ($N_2$), ammonia ($NH_3$), hydrazine ($N_2H_4$), or an alkyl-hydrazine (e.g. tertiary butyl hydrazine ($C_4H_{12}N_2$).

In some embodiments, the process step 204 comprises, contacting the substrate with one or more reactive species generated from a gas selected from the group consisting of hydrogen ($H_2$), nitrogen ($N_2$), and mixtures thereof. In some embodiments, the process step 204 can comprise, contacting the substrate with nitrogen reactive species generated from a gas consisting essentially of nitrogen ($N_2$). In some embodiments, process step 204 comprises, contacting the substrate with one or more reactive species generated from a plasma produced from a gas consisting essentially of nitrogen ($N_2$) and hydrogen ($H_2$).

In some embodiments, the one or more reactive species generated from the plasma (also referred as the "plasma pulse") may contact the substrate for a time period between about 0.1 seconds to about 20 seconds, or about 0.5 seconds to about 10 seconds, or even about 0.5 seconds to about 5 seconds. In some embodiments, the reactive species generated from the plasma may contact the substrate for a time period of between approximately 0.5 seconds and 10 seconds.

In some embodiments, the plasma pulse can be generated employing an RF powered plasma in the reaction chamber. In some embodiments, a plasma power of at least 10 W to at most 2,000 W can be used to generate the plasma pulse. In some embodiments, a plasma power of at least 20 W to at most 150 W can be used to generate the plasma pulse. In some embodiments, a plasma power of at least 50 W to at most 100 W can be used to generate the plasma pulse. In some embodiments, a plasma power of at least 30 W to at most 150 W can be to generate the plasma pulse. In some embodiments, a plasma power of at least 50 W to at most 100 W can be used to generate the plasma pulse. In some embodiments, a plasma power of less than 2,000 W, or less than 1,000 W, or less than 750 W, or less than 500 W, or less than 300 W, 150 W, or less than 100 W, or less than 75 W, or less than 50 W, or less than 40 W, or less than 30 W, or less than 20 W, or between 10 W and 2,000 W, or between 15 W and 1,000 W, or between 20 W and 120 W can be used to generate the plasma pulse.

In some embodiment, the methods of the present disclosure can be executed employing a direct plasma generated within the reaction chamber. In such embodiments, the methods of the present disclosure can be executed in an apparatus comprising two electrodes between which the substrate is positioned. The electrodes can be positioned parallel at a predetermined distance called an electrode gap. In some embodiments, the electrode gap can be at least 5 mm to at most 30 mm, at least 5 mm to at most 10 mm, or at least 10 mm to at most 20 mm, or of at least 20 mm to at most 30 mm.

In some embodiments, a plasma frequency of at least 40 kHz to at most 2.45 GHz can be used during the plasma pulses, or a plasma frequency of at least 40 kHz to at most 80 kHz can be used during the plasma pulses, or a plasma frequency of at least 80 kHz to at most 160 kHz can be used during the plasma pulses, or a plasma frequency of at least 160 kHz to at most 320 kHz can be used during the plasma pulses, or a plasma frequency of at least 320 kHz to at most 640 kHz can be used during the plasma pulses, or a plasma frequency of at least 640 kHz to at most 1280 kHz can be used during the plasma pulses, or a plasma frequency of at least 1280 kHz to at most 2500 kHz can be used during the plasma pulses, or a plasma frequency of at least 2.5 MHz to at least 5 MHz can be used during the plasma pulses, or a plasma frequency of at least 5 MHz to at most 60 MHz can be used during the plasma pulses, or a plasma frequency of at least 5 MHz to at most 10 MHz can be used during the plasma pulses, or a plasma frequency of at least 10 MHz to at most 20 MHz can be used during the plasma pulses, or a plasma frequency of at least 20 MHz to at most 30 MHz can be used during the plasma pulses, or a plasma frequency of at least 30 MHz to at most 40 MHz can be used during the plasma pulses, or a plasma frequency of at least 40 MHz to at most 50 MHz can be used during the plasma pulses, or a plasma frequency of at least 50 MHz to at most 100 MHz can be used during the plasma pulses, or a plasma frequency of at least 100 MHz to at most 200 MHz can be used during the plasma pulses, or a plasma frequency of at least 200 MHz to at most 500 MHz can be used during the plasma pulses, or a plasma frequency of at least 500 MHz to at most 1000 MHz can be used during the plasma pulses, or a plasma frequency of at least 1 GHz to at most 2.45 GHz can be used during the plasma pulses. In exemplary embodiments, the plasma can be an RF plasma, and RF power can be provided at a frequency of 13.56 MHz. In further exemplary embodiments, the plasma can be an RF plasma, and RF power can be provided at a frequency of 60 MHz.

In some embodiments of the disclosure, an individual plasma pulse, employed in the generation of reactive species, can be split into a number of constituent micropulses. For example, a number of micropulses may employed as an alternative to an individual static steady state plasma pulse, and such micropulses may comprise a duty cycle between 10% to 90% (RF power on-time), with a plasma frequency of between 10 Hz and 100000 Hz.

After a time period sufficient to react the previously absorbed boron with the one or more reactive species (e.g., nitrogen reactive species) generated from the plasma pulse, any excess reactant and reaction byproducts may be removed from the reaction chamber. As with the removal of the boron precursor, this step may comprise stopping generation of reactive species and continuing to flow an inert gas, such as a gas comprising nitrogen, helium, and in some embodiments additionally argon. The inert gas flow may flow for a time period sufficient for excess reactive species and volatile reaction byproducts to diffuse out of and be purged from the reaction chamber. For example, the purge process may be utilized for a time period between about 0.1 seconds to about 10 seconds, or about 0.1 seconds to about 4.0 seconds, or even about 0.1 seconds to about 0.5 seconds.

The exemplary method 200 wherein the substrate is alternately and sequentially contacted with the boron precursor and contacted the reactive species may constitute a unit deposition cycle. In some embodiments of the disclosure, the exemplary PEALD process 200 may comprise, repeating the unit deposition cycle one or more times, as illustrated by the process loop 205 in FIG. 2. For example, the exemplary PEALD process of exemplary method 200 may continue with a decision gate 206 which determines if the method 200 continues or is terminated. For example, the decision gate of step 206 can be determined based on reaching a predetermined end criterion. As non-limiting examples, the end criterion can be based on reaching a desired thickness of the a-BN layer, or alternatively by performing a predetermined number of deposition cycles. If the end criterion of decision gate 206 is not attained then the exemplary method 200 may return to step 202 and the processes of contacting the substrate with the boron precursor (step 202) and contacting the substrate with the reactive species (step 204) may be repeated one or more times. For example, in some embodiments, the exemplary method 200 may comprise, from at least 10 to at most 30,000 deposition cycles, or from at least 10 to at most 3,000 deposition cycles, or from at least 10 to at most 1,000 deposition cycles, or from at least 10 to at most 500 deposition cycles, or from at least 20 to at most 200 deposition cycles, or from at least 50 to at most 150 deposition cycles, or from at least 75 to at most 125 deposition cycles, for example 100 deposition cycles.

The amount of a-BN deposited during each individual deposition cycle of the exemplary PEALD process 200 may be referred to as the growth rate per cycle (GPC). In some embodiments, the GPC for the exemplary PEALD process 200 may be between 0.1 Å/cycle and 1.0 Å/cycle, or between 0.2 Å/cycle and 0.8 Å/cycle, or between 0.3 Å/cycle and 0.6 Å/cycle, or between 0.4 Å/cycle and 0.5 Å/cycle. In some embodiments, the GPC for the exemplary PEALD process 200 may be greater than 0.1 Å/cycle, or greater than 0.2 Å/cycle, or greater than 0.3 Å/cycle, or greater than 0.4 Å/cycle, or greater than 0.5 Å/cycle, or greater than 0.6 Å/cycle, or greater than 0.7 Å/cycle, or greater than 0.8 Å/cycle, or greater than 0.9 Å/cycle, or greater than 1.0 Å/cycle.

In some embodiment, the total deposited thickness of the a-BN layer deposited by employing the exemplary PEALD process 200 may be less than 100 nm, or less than 50 nm, or less 25 nm, or less than 20 nm, or less than 15 nm, or less than 10 nm, or less than 5 nm, or less than 2 nm. In some embodiment, the total deposited thickness of the a-BN layer deposited employing exemplary PEALD process 200 may be between 1 nm and 100 nm, or between 2 nm and 50 nm, or between 5 nm and 30 nm, or between 10 nm and 20 nm. In some embodiments, the deposited a-BN layer may have a thickness non-uniformity (NU %), of less 3%, or less than 2%, or less than 1%. In some embodiments, the deposited a-BN layer may have a thickness non-uniformity (NU %) between 1% and 3%.

Once the end criterion of decision gate 206 has been attained, the exemplary method 200 may exit by means of an end of PEALD process step (step 208) and the a-BN layer may be subjected to additional processes as desired.

While the PEALD deposition cycle is generally referred to herein as beginning with the boron phase, it is contemplated that in other embodiments the cycle may begin with the reactive species phase. One of skill in the art will recognize that the first precursor phase generally reacts with the termination left by the last phase in the previous cycle. Thus, while no reactant may be previously absorbed on the substrate surface or present in the reaction chamber if the reactive species is the first phase in the PEALD cycle, in subsequent cycles the reactive species phase will effectively follow the boron phase. In some embodiments, one or more different PEALD cycles are provided in the deposition process.

A further overview of a non-limiting exemplary unit deposition cycle of the PEALD processes of the current disclosure is illustrated with reference to FIG. 3. As illustrated in FIG. 3, the horizontal axis represents the time parameter but does not necessarily represent the actual time length of individual processes, and the vertical axis represents an ON-state or OFF-state for gas flow and RF power, wherein a raised level on the vertical axis of each parameter represents an ON-state. However, the vertical axis of each line does not necessarily represent the actual quantity of the associated parameter, whereas a bottom level of each line on the vertical axis represents an OFF-state, i.e., zero gas flow, or no RF power supplied.

In brief, in a first period 310 (i.e., the precursor pulse period) of the unit deposition cycle the boron precursor may be pulsed into the reaction chamber along with a flow of carrier gas/inert gas. In this first period 310, the boron precursor can be introduced into the reaction chamber, contact the substrate, and chemisorb on the surface of the substrate forming at most a monolayer. In a second period 320 (i.e., a purge period) the flow of the boron precursor is stopped and the flow of the carrier gas/inert gas can continue such that the reaction chamber is purged of excess boron precursor and any by-products. In a third period 330 (i.e., the RF pulse period) the reactive species producing gas (i.e., the plasma forming gas) is introduced into the reaction chamber and a pulse of RF power is supplied to the gas to excite a plasma and generates the reactive species which react with the chemisorbed boron precursor thereby forming an a-BN layer. In some embodiments, the flow of reactive species producing gas flow may be allowed to stabilize for a period of time prior to applying the RF power to the plasma producing gas (not shown). In some embodiments, the pulse of RF power in the third period 330 may be supplied as a number of micropulses as denoted by the dashed line 360 in FIG. 3 and described herein above. In a fourth period 340 (i.e., a purge period) the RF power, boron precursor flow, and reactive gas producing gas flow are in the OFF-state and a carrier gas/inert gas flow may continue thereby purging the reaction chamber of excess reactive species and any reaction by-products. In some embodiments, the reactive species producing gas may flow continuously throughout the deposition cycle (as shown by optionally dashed line 350) and in such embodiments the reactive species producing gas can act as both the gas for reactive species generation (when the RF power is applied) and can also act as a purge gas.

The embodiments of the present disclosure can include methods for depositing conformal a-BN layers. For example, in some embodiments of the disclosure, the a-BN layers may be deposited on a non-planar surface of a substrate comprising a number of high aspect ratio features, such as, but not limited to, vertical features, fin structures, and trench features. In some embodiments, the substrate may comprise a number of non-planar features having an aspect ratio (height:width) greater than 2:1, or greater than 5:1, or greater than 10:1, or greater than 25:1, or greater than 50:1, or even greater than 100:1, wherein “greater than” as used in this example refers to a greater height of the high aspect ratio feature.

In more detail and with reference to FIG. 4, an a-BN layer 400 may be deposited over the surface of a number of high aspect ratio features 402 disposed in and/or on a substrate 404 (e.g., a non-planar substrate). In some embodiments, the a-BN layer 400 may be deposited in a conformal manner over the high aspect ratio features 402. As used herein, the term "conformal deposition" and an a-BN layer deposited "conformally" can refer an a-BN layer which is deposited over a non-planar surface (e.g., a surface including a number high aspect ratio feature) with a step coverage greater than 85%, or greater than approximately 90%, or greater than 95%, or greater than 99%, or even substantially equal to 100%. As used herein, the term "step coverage" is defined as a percentage ratio of the thickness of the a-BN layer disposed on a vertical surface 406 (e.g., a sidewall or inclined surface) of a high aspect ratio feature 402 compared to the thickness of the a-BN layer disposed on a horizontal surface 408 (e.g., the top and bottom substantially planar surfaces) of a high aspect ratio feature 402, e.g., a-BN vertical thickness:a-BN horizontal thickness.

An a-BN layer deposited according to embodiments of the present disclosure can exhibit a low dielectric constant making such a-BN layers useful for various semiconductor device structure applications. Therefore, in some embodiments, the a-BN layers deposited by the embodiments disclosed herein may have a dielectric constant (K) less than 4.5, or less than 4.0, or less than 3.5, or less than 3.0, or less than 2.5, or less than 2.0, or less than 1.5, or less than 1.2. In some embodiments, the a-BN layers disclosed herein may have a dielectric constant (K) between 1.2 and 4.5, or between 1.5 and 4.0, or between 2.0 and 3.5.

In some cases, a-BN layers deposited by the methods disclosure herein can have stochiometric compositions. Therefore, in some embodiments, the a-BN layers deposited by the methods disclosed herein may have a composition ratio of boron to nitrogen (B:N) of 1:1. In some embodiments it may be advantageous to deposit an a-BN layer with a non-stoichiometric composition, i.e., with either a boron rich composition or a nitrogen rich composition. Therefore, in some embodiments, the a-BN layers deposited by the methods disclosed herein may have a boron rich composition comprising a ratio of boron to nitrogen (B:N) greater than 1:1, in other words an a-BN layer having a composition having a greater amount of boron compared with nitrogen. In such boron rich a-BN layers the ratio of boron to nitrogen (B:N) may be greater than 1:0.95, or greater than 1:0.93, or greater than 1:0.9, or greater than 1:0.8, or greater than 1:0.7, or between 1:0.95 and 1:0.7. Alternatively, in some embodiments, a nitrogen rich composition may be preferred and the a-BN layers may be deposited with a composition ratio of boron to nitrogen (B:N) of 0.9:1 or 0.93:1, or 0.95:1.

As a non-limiting example, a desired composition of the a-BN layers deposited by the PEALD methods disclosed herein may be controlled by the selection of the gas employed in generating the plasma pulse and the resulting reactive species generated. For example, in some embodiments, the plasma (i.e., the plasma pulse) can be produced from a gas selected from the group consisting of hydrogen, nitrogen and mixtures thereof. In some embodiments, the plasma pulse can be produced from a gas consisting essentially of hydrogen ($H_2$), and nitrogen ($N_2$). In some embodiments, the plasma pulse can be produced from a gas consisting essentially of nitrogen ($N_2$).

In addition to depositing an a-BN layer with a preferred composition of boron to nitrogen ratio (B:N), the embodiments of the present disclosure can deposit a-BN layers with low impurity concentrations. For example, the a-BN layers of the present disclosure may comprise an oxygen impurity concentration (as given by the atomic percentage of oxygen present in the layer) of less than 20 atomic-%, or less than 15 atomic-%, or less than 10 atomic-%, or less than 5 atomic-%, or less than 2.5 atomic-%. In some embodiments, the a-BN layers of the present disclosure may comprise an oxygen impurity concentration between 2.5 atomic-% and 20 atomic-%, or between 4 atomic-% and 15 atomic-%, or 5 atomic-% and 10 atomic-%. The impurity concentrations in the a-BN layers of the present disclosure may be determined by a number of techniques, such as, x-ray photoelectron spectroscopy (XPS), for example.

In addition, the a-BN layers of the present disclosure may comprise low concentrations of halide impurities. For example, the a-BN layers of the present disclosure may comprise an halide impurity concentration of less than 0.5 atomic-%, or less than 0.4 atomic-%, or less than 0.3 atomic-%, or less than 0.2 atomic-%, or less than 0.1 atomic-%. In some embodiments, the a-BN layers of the present disclosure may comprise an iodine impurity concentration of less than 0.5 atomic-%, or less than 0.4 atomic-%, or less than 0.3 atomic-%, or less than 0.2 atomic-%, or less than 0.1 atomic-%. In some embodiments, the a-BN layers of the present disclosure may comprise an iodine impurity concentration between 0.1 atomic-% and 0.4 atomic-%, or between 0.1 atomic-% and 0.3 atomic-%, or between 0.1 atomic-% and 0.2 atomic-%.

In some embodiments, the a-BN layers deposited according the PEALD processes disclosed herein may advantageously exhibit low wet rate ratios, where the wet etch rate ratio (WERR) is defined herein as the ratio of the wet etch rate of an a-BN layer compared with the wet etch rate of thermal silicon oxide in dilute hydrofluoric acid (1:100). Therefore, in some embodiments, the WERR of the a-BN layers deposited by the PEALD processes of the present disclosure may be less than 1.0, or less than 0.5, or less than 0.3, or less than 0.2, or less than 0.1 or less than 0.05. In some embodiments, the a-BN layers of the present disclosure may have a WERR between 0.05 and 0.15, between 0.1 and 1.0, or between 0.2 and 0.4.

In the tests of the method according to the current disclosure it was discovered that it is possible to deposit layers with very low WERR, such as WERR of from about 0 to about 0.15. The excellent conformality of the a-BN layer may be retained after a HF etching process, making the properties of the material according to the current disclosure attractive for semiconductor device fabrication. Particularly, the current material may be used as a spacer material in various semiconductor applications.

Particularly, it was discovered that generating reactive species from a gas consisting essentially of $N_2$, may be useful in depositing high-quality (i.e. low WERR, low dielectric constant) a-BN layers. Advantageously, the flow of $N_2$ gas in such embodiments was kept between about 200 sccm and 600 sccm. In some embodiments, the N2 gas flow was about 200 sccm, or about 300 sccm, or about 400 sccm, or about 500 sccm, or about 600 sccm. Susceptor temperature was at most 300° C., which may be beneficial in view of achieving a greater proportion of amorphous BN in the a-BN layer relative to polycrystalline BN. and duration of a plasma pulse between 2 seconds and 10 seconds. In some embodiments, the duration of a plasma pulse was about 2 seconds, or about 4 seconds, about 6 seconds, about 8 seconds or about 10 seconds.

The use of amorphous materials as low-K layers in semiconductor device structures has been investigated in other material systems. A number of these other amorphous low-K materials demonstrate poor long-term stability which can result in their properties changing, and even deteriorating, over time. In contrast, the a-BN layers deposited according to the embodiments of the present disclosure exhibit long term stability and as result stable material properties.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method for forming an amorphous boron nitride layer, the method comprising:

seating a non-planar substrate within a reaction chamber; and depositing the amorphous boron nitride layer on the non-planar substrate by performing one or more deposition cycles of a plasma enhanced atomic layer deposition (PEALD) process, wherein a unit deposition cycle of the PEALD process comprises:

contacting the non-planar substrate with a vapor phase reactant comprising a boron precursor; and contacting the non-planar substrate with one or more reactive species generated from a plasma produced from a gas selected from the group consisting of hydrogen ($H_2$), nitrogen ($N_2$), ammonia ($NH_3$), and mixtures thereof, wherein the one or more reactive species react with the boron precursor to form the amorphous boron nitride layer, and wherein the amorphous boron nitride layer is deposited conformally with a step coverage greater than 90%.

2. The method of claim 1, wherein the boron precursor comprises boron triiodide ($BI_3$).

3. The method of claim 1, wherein the plasma is produced from a gas consisting essentially of nitrogen ($N_2$) and hydrogen ($H_2$).

4. The method of claim 1, wherein the plasma is produced from a gas consisting essentially of nitrogen ($N_2$).

5. The method of claim 1, further comprising heating the non-planar substrate to a deposition temperature between 150° C. and 350° C.

6. The method of claim 1, wherein the amorphous boron nitride layer is deposited at a growth rate per cycle (GPC) between 0.2 nm/cycle and 0.4 nm/cycle.

7. The method of claim 1, wherein the amorphous boron nitride layer is deposited with a dielectric constant of less than 4.

8. The method of claim 7, wherein the amorphous boron nitride layer is deposited with a dielectric constant of less than 3.

9. The method of claim 1, wherein the amorphous boron nitride layer is deposited with a composition ratio of boron to nitrogen of 1:1 or greater.

10. The method of claim 1, wherein the amorphous boron nitride layer is deposited with a wet etch rate ratio (WERR) of less than 0.2.

11. The method of claim 1, wherein the one or more reactive species are generated by a direct plasma.

12. A method for forming an amorphous boron nitride layer, the method comprising:

seating a substrate within a reaction chamber; and depositing the amorphous boron nitride layer on the substrate by performing one or more deposition cycles of a plasma enhanced atomic layer deposition (PEALD) process, wherein a unit deposition cycle of the PEALD process comprises:

contacting the substrate with a vapor phase reactant comprising a boron triiodide ($BI_3$) precursor; and contacting the substrate with one or more nitrogen reactive species generated from a gas consisting essentially of nitrogen ($N_2$) and hydrogen (H2), wherein the one or more nitrogen reactive species react with the boron triiodide (BI3) precursor to form the amorphous boron nitride laver.

13. The method of claim 12, wherein the substrate comprises a non-planar substrate including a number of high aspect ratio features having an aspect ratio greater than 20:1.

14. The method of claim 13, wherein the amorphous boron nitride layer is deposited conformally over the non-planar substrate with a step coverage greater than 90%.

15. The method of claim 12, wherein the amorphous boron nitride layer is deposited with a dielectric constant of less than 3.

16. The method of claim 12, wherein the amorphous boron nitride layer is deposited with a wet etch rate ratio (WERR) of less than 0.2.

17. The method of claim 12, wherein a plasma power is between 100 W and 800 W.

18. A method for forming an amorphous boron nitride layer, the method comprising:

seating a substrate within a reaction chamber; and depositing the amorphous boron nitride layer on the substrate by performing one or more deposition cycles of a plasma enhanced atomic layer deposition (PEALD) process, wherein a unit deposition cycle of the PEALD process comprises:

heating the substrate to a temperature between 150° C. and 300° C.:

contacting the substrate with a vapor phase reactant comprising boron triiodide ($BI_3$); and contacting the substrate with one or more reactive species generated from a plasma produced from a gas consisting essentially of nitrogen ($N_2$), and hydrogen ($H_2$), wherein the one or more reactive species react with the boron triiodide (BI3) to form the amorphous boron nitride layer.

19. The method of claim 18, wherein the amorphous boron nitride layer is deposited with a composition ratio of boron to nitrogen of 1:1, or greater.

20. The method of claim 18, wherein the amorphous boron nitride layer is deposited with a wet etch rate ratio (WERR) of less than 0.2.

* * * * *